US007626433B2

(12) United States Patent
Hoess

(10) Patent No.: US 7,626,433 B2
(45) Date of Patent: Dec. 1, 2009

(54) FLIP-FLOP CIRCUIT ASSEMBLY

(75) Inventor: Wolfgang Hoess, Graz (AT)

(73) Assignee: Austriamicrosystems AG, Unterpremstätten (AT)

(*) Notice: Subject to any disclaimer, the term of this patent is extended or adjusted under 35 U.S.C. 154(b) by 22 days.

(21) Appl. No.: 10/554,970

(22) PCT Filed: Feb. 19, 2004 (Under 37 CFR 1.47)

(86) PCT No.: PCT/EP2004/001615

§ 371 (c)(1), (2), (4) Date: Feb. 5, 2007

(87) PCT Pub. No.: WO2004/098061

PCT Pub. Date: Nov. 11, 2004

(65) Prior Publication Data

US 2007/0146030 A1 Jun. 28, 2007

(30) Foreign Application Priority Data

Apr. 28, 2003 (DE) ................................ 103 19 089

(51) Int. Cl.
*H03K 3/00* (2006.01)

(52) U.S. Cl. ....................... 327/199; 327/200; 327/201; 327/202; 327/214; 327/218

(58) Field of Classification Search .......... 327/199–225
See application file for complete search history.

(56) References Cited

U.S. PATENT DOCUMENTS 4,601,049 A 7/1986 Muenchen
5,828,237 A 10/1998 Keating
5,844,437 A * 12/1998 Asazawa et al. ............ 327/202
5,969,556 A * 10/1999 Hayakawa .................. 327/202
6,268,752 B1 7/2001 Takahashi
6,559,693 B2 * 5/2003 Tung et al. .................. 327/115
7,215,170 B1 * 5/2007 Kang et al. ................. 327/218
7,236,029 B2 * 6/2007 Gossmann .................. 327/202
2002/0067191 A1 6/2002 Asam

FOREIGN PATENT DOCUMENTS

DE 33 43 573 6/1985

(Continued)

OTHER PUBLICATIONS

Translation of International Preliminary Examination Report for Application No. PCT/EP2004/001615.

(Continued)

*Primary Examiner*—Lincoln Donovan
*Assistant Examiner*—John W Poos
(74) *Attorney, Agent, or Firm*—Fish & Richardson P.C.

(57) ABSTRACT

A flip-flop circuit arrangement having a total of four differential amplifiers (1, 2, 3, 4), which are connected to one another to produce a D flip-flop, is specified. According to the suggested principle, the two shared emitter nodes (E1, E2) of the differential amplifiers (1, 2, 3, 4) are connected via a switch pair (S1, S2) to supply potential and are activated by a differential input clock signal at a control input (CN, CP). The present flip-flop circuit is operable using especially low supply voltage (VCC) and is preferably suitable for constructing frequency dividers or shift registers.

14 Claims, 1 Drawing Sheet

FOREIGN PATENT DOCUMENTS

| | | |
|---|---|---|
| EP | 0 448 835 | 10/1991 |
| EP | 0 599 517 | 6/1994 |
| JP | 57-053136 | 3/1982 |
| JP | 03-022622 | 1/1991 |
| JP | 03034718 | 2/1991 |
| JP | 06-085659 | 3/1994 |
| JP | 06-268496 | 9/1994 |
| JP | 07046089 | 2/1995 |
| JP | 07-074618 | 3/1995 |
| JP | 09069759 | 3/1997 |
| JP | 09326682 | 12/1997 |

OTHER PUBLICATIONS

English translation of Examination Report from corresponding Application JP 2006-500038 dated Jul. 8, 2008.

* cited by examiner

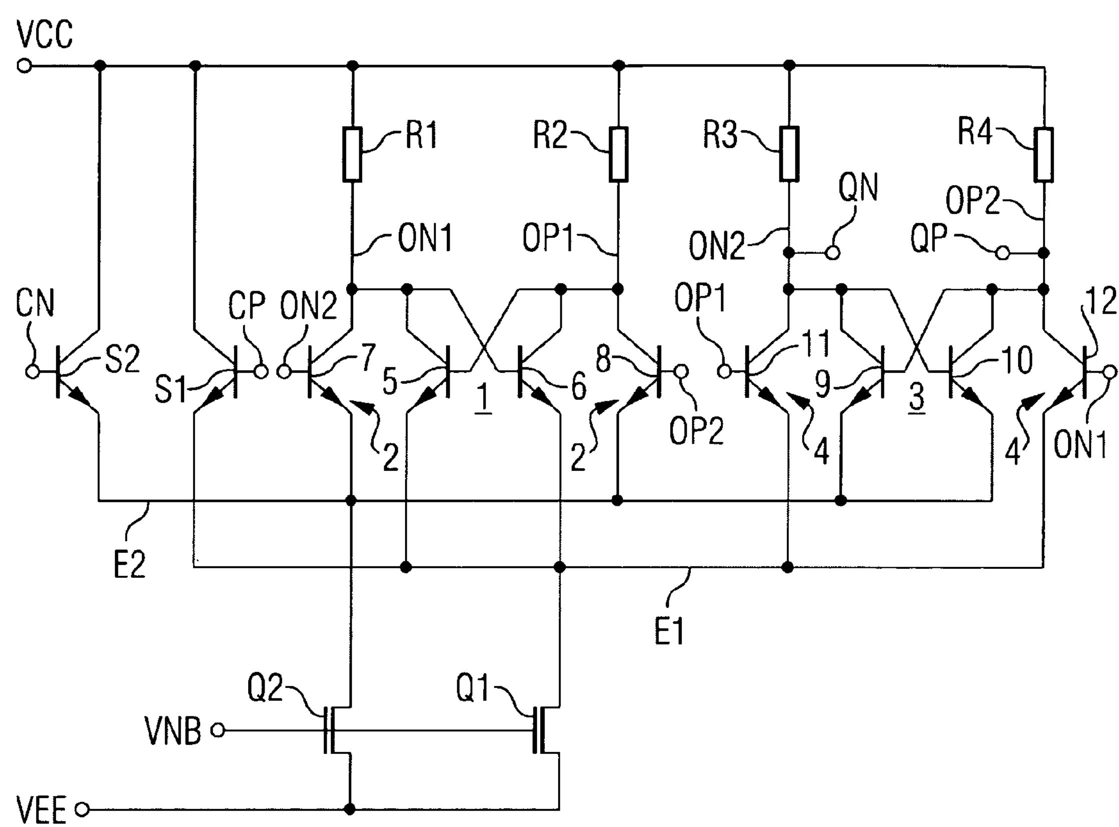
VCC
R1
R2
R3
R4
QN
OP2
ON1
OP1
ON2
QP
CN
CP
ON2
OP1
12
S2
S1
7
5
1
6
8
11
9
3
10
OP2
2
2
4
4
ON1
E2
E1
Q2
Q1
VNB
VEE

FLIP-FLOP CIRCUIT ASSEMBLY

TECHNICAL FIELD

This patent application relates to a flip-flop circuit arrangement.

BACKGROUND

Flip-flop circuits constructed in integrated circuit technology are among the basic circuit blocks of integrated circuit technology and have manifold fields of application.

Flip-flop circuits may be constructed using emitter-coupled transistors in ECL (emitter coupled logic) circuit technology, for example.

Flip-flop circuits of this type for rapid signal processing are normally constructed symmetrically and are designed for processing differential signals.

Known flip-flop circuits in ECL technology have the problem that, because of their construction, they normally require relatively large operating voltages, since at least two base-emitter voltages always drop out between the two supply potentials. However, it is desirable in modern communication electronics in particular to be able to operate flip-flop circuits with smaller and smaller supply voltages.

SUMMARY

Described herein is a flip-flop circuit arrangement which may be constructed in ECL circuit technology and which may be operated using a lower supply voltage.

In one aspect, a flip-flop circuit arrangement comprises:

a pair of input terminals, designed for supplying a differential input clock signal, a pair of output terminals, designed for tapping a differential output signal, four differential amplifiers, each having two transistors, whose controlled sections are each positioned in a series circuit with a resistor, the series circuits being positioned between a supply potential terminal and a first and/or second shared emitter node, whose control terminals are coupled to one another to form a D flip-flop structure and in which the pair of output terminals is formed at the output of at least one differential amplifier, a first current source, which connects the first shared emitter node to a reference potential terminal, a second current source, which connects the second shared emitter node to the reference potential terminal, a first switch, whose controlled section is connected between supply potential terminal and first emitter node, and a second switch, whose controlled section is connected between supply potential terminal and second emitter node, the first and the second switch each having a control terminal, which form the pair of input terminals.

The suggested flip-flop circuit arrangement is constructed symmetrically and is designed for guiding differential signals.

The circuit may be implemented in ECL circuit technology.

According to the suggested principle, the two switches which are activated using the differential clock signal are related directly to supply potential from the two emitter nodes.

Accordingly, the advantage results that only one base-emitter voltage UBE drops out between supply potential terminal and reference potential terminal if the differential amplifier transistors and the switches are implemented in bipolar technology, and therefore the circuit may be operated using especially low voltage.

In addition, it corresponds to the suggested principle that only two current sources are required, which couple each of the two shared emitter nodes to reference potential. The current sources for all differential amplifiers are thus combined into a current source pair.

An additional advantage of the suggested principle results in that, due to the lower number of required current sources, the current required for the circuit is reduced.

Still a further reduction of the current required for the circuit results through implementation of the first and second switches, which are activated by the differential clock signal, as transistors which operate as emitter sequencers. Therefore, emitter sequencers at the output of the flip-flop circuit may advantageously be dispensed with.

Nonetheless, it is possible, using the suggested circuit, to connect the output of a flip-flop implemented as suggested to a data input thereof or directly to a further, identical flip-flop. Accordingly, frequency divider circuits and/or shift registers may be constructed without problems using the suggested flip-flop and emitter sequencers at the output may nonetheless be dispensed with. According to a refinement of the suggested flip-flop circuit arrangement, the four differential amplifiers are implemented so that a first differential amplifier is provided, comprising a first pair of emitter-coupled transistors in the first emitter node, whose collector terminals form a first circuit node and a second circuit node and whose base terminals are cross connected to their collector terminals, a second differential amplifier is provided, comprising a second pair of emitter-coupled transistors in the second emitter node, whose collector terminals are connected to the first circuit node and/or to the second circuit node and whose base terminals form a third circuit node and a fourth circuit node, a third differential amplifier is provided, comprising a third pair of emitter-coupled transistors in the second emitter node, whose collector terminals are connected to the third circuit node and/or to the fourth circuit node and whose base terminals are cross connected to their collector terminals, and a fourth differential amplifier is provided, comprising a fourth pair of emitter-coupled transistors in the first emitter node, whose collector terminals are connected to the third circuit node and/or to the fourth circuit node and whose base terminals are connected to the second circuit node and/or to the first circuit node.

According to a further embodiment of the suggested principle, the first, the second, the third, and the fourth circuit nodes, which are formed at the particular collector terminals of the transistors of the differential amplifiers, are each connected via a resistor to the supply potential terminal.

The resistors may be implemented as current sources. The current sources may be implemented as wired transistors suitable for this purpose. The current source transistors may be implemented as field effect transistors in this case.

The differential amplifiers and the two switches which are activated using the differential clock signal may be implemented in bipolar circuit technology. The switch transistors and differential amplifier transistors may be implemented as npn transistors.

The first and the second current sources, which connect the two shared emitter nodes to the reference potential terminal of the flip-flop circuit, may be implemented in MOS circuit technology and each comprise a transistor. The current source transistors may be implemented as n-channel transistors of a self-controlling type. The control terminals of the transistors which form the first and the second current sources may be connected to one another and applied to a constant reference potential. In this case, the current source transistors may each be output transistors of a current balancer. Alternatively, the first and second current sources may also be implemented as resistors or bipolar transistors.

Further details and advantageous embodiments of the suggested principle are the object of the subclaims.

Embodiments will be explained in greater detail in the following on the basis of the single FIGURE.

DESCRIPTION OF THE DRAWING

The FIGURE shows an exemplary embodiment of the present flip-flop circuit arrangement constructed in ECL circuit technology on the basis of a circuit diagram.

DETAILED DESCRIPTION

The FIGURE shows a flip-flop circuit arrangement which is constructed symmetrically and which is designed for processing differential signals. The present flip-flop circuit arrangement is constructed in emitter coupled logic (ECL) circuit technology and may be implemented as an integrated circuit.

The flip-flop circuit arrangement comprises a pair of input terminals CP, CN, to which a differential clock signal may be supplied. The pair of input terminals CN, CP is formed on each base terminal of each assigned transistor S1, S2. The npn transistors S1, S2, which operate as switches, have their two collector terminals directly connected to a supply potential terminal VCC. The emitter terminal of the first switch S1 is connected to a first shared emitter node E1. The emitter terminal of the second switch S2 is connected to a second shared emitter node. The first and the second emitter nodes E1, E2 are connected via one constant current source Q1, Q2 each to a reference potential terminal VEE. The constant current sources Q1, Q2 are implemented in the present case as MOS field effect transistors of the n-channel type. The gate terminals of the current source transistors Q1, Q2 are connected to one another and form a terminal VNB for supplying a reference level. A current source may be connected to this terminal via a transistor diode, so that the transistors Q1, Q2 each form the output-side transistor of a current balancer.

The actual core of the flip-flop circuit arrangement is formed by a total of four differential amplifiers 1, 2, 3, 4, whose inputs and outputs are connected as described in the following to the two summation nodes E1, E2. The transistors of the differential amplifiers 1 through 4 are implemented in this case in bipolar circuit technology as npn transistors and are switched in ECL circuit technology.

The first differential amplifier 1 comprises two emitter-coupled transistors 5, 6, whose emitter terminals are connected directly to one another and to the first emitter node E1. The collector terminal of the first transistor 5 of the first differential amplifier 1 forms a first circuit node ON1, the collector terminal of the second transistor 6 of the first differential amplifier 1 forms a second circuit node OP1. The base terminal of the first transistor 5 is connected to the collector terminal of the second transistor 6 and the base terminal of the second transistor 6 is connected to the collector terminal of the first transistor 5. The first circuit node ON1 is connected via a first resistor R1 to the supply potential terminal VCC.

The second circuit node OP1 is connected via a second resistor R2 to the supply potential terminal VCC.

The second differential amplifier 2 comprises a first transistor 7 and a second transistor 8, whose emitter terminals are connected to one another and to the second shared emitter node E2. The collector terminal of the first transistor 7 of the second differential amplifier 2 is connected to the first circuit node ON1, the collector terminal of the second transistor 8 of the second differential amplifier 2 is connected to the second circuit node OP1. The base terminal of the first transistor 7 is connected to a third circuit node ON2, and the base terminal of the second transistor 8 is connected to a fourth circuit node OP2.

The third differential amplifier 3 comprises a first transistor 9 and a second transistor 10, whose emitter terminals are connected to one another and to the second shared emitter node E2 of the circuit. Collector and base terminals of the transistors 9, 10 of the third differential amplifier 3 are cross connected to one another like the transistors 5, 6 in the first differential amplifier 1. The collector terminal of the first transistor 9 of the third differential amplifier 3 is connected to the third circuit node ON2, the collector terminal of the second transistor 10 of the third differential amplifier 3 is connected to the fourth circuit node OP2.

The fourth differential amplifier 4 comprises two emitter-coupled transistors 11, 12, whose shared emitter terminal is connected to the first summation node and/or shared emitter node E1. The collector terminal of the first transistor 11 is connected to the third circuit node ON2, the collector terminal of the second transistor 12 of the fourth differential amplifier 4 is connected to the fourth circuit node OP2. The base terminal of the first transistor 11 is connected to the second circuit node OP1, the base terminal of the second transistor 12 of the fourth differential amplifier 4 is connected to the first circuit node ON1.

The third and the fourth circuit nodes ON2, OP2 form the pair of output terminals QN, QP of the flip-flop circuit arrangement.

The four circuit nodes ON1, OP1, ON2, OP2 of the circuit arrangement are each connected via a resistor R1, R2, R3, R4 to the supply potential terminal VCC.

The supply voltage required for operating the circuit according to the FIGURE results from the potential difference between the supply potential terminal VCC and the reference potential terminal VEE. The minimum required voltage results from the sum of at least three voltages, namely the voltage which drops out over the resistors R1 through R4, a base-emitter voltage, which drops out over the transistors 5 through 12, S1, S2, and a current source voltage, which drops out via the current sources Q1, Q2. In the circuit shown, in which, for example, a drop of 0.3 V via the collector resistors, a voltage drop, also of 0.3 V, at the current balancer transistors Q1, Q2, and a base-emitter voltage of 0.9 V at the transistors 5 through 12, S1, S2, are provided, a minimum supply voltage for realistic operation of the D flip-flop of only 1.5 V results in the present number example.

The two switches S1, S2 operate as emitter sequencers and are connected in a bypass circuit to the summation nodes E1, E2 of the differential amplifiers 1 through 4. The functionality of an output emitter sequencer is accordingly already integrated into the circuit, so that, advantageously, no emitter sequencer is necessary at the output QN, QP. Accordingly, the circuit offers an additional current savings.

The circuit according to the FIGURE is especially suitable for being wired as frequency divider, which causes a frequency division by two. For this purpose, the outputs QN, QP of the flip-flop, which is a D flip-flop, are connected to the data inputs of the flip-flop in negative feedback. A signal having half the clock frequency applied at the clock input CN, CP may then be tapped at the output QN, QP.

A further, field of application of the circuit is the construction of shift registers. For this purpose, the outputs QN, QP of a flip-flop according to FIG. 1 are each connected to the data input pair of a downstream, identical flip-flop. The clock inputs CN, CP of all flip-flops connected in this way to form a shift register are connected to one another and to a shared clock input of the register.

In alternative embodiments, for example, a transistor may be provided instead of the resistors R1 through R4. Bipolar transistors may also be replaced by unipolar field affect transistors and/or vice versa.

The invention claimed is:

1. A flip-flop circuit comprising input terminals to provide a differential clock signal;

output terminals to provide a differential output signal;

differential amplifiers, each of the differential amplifiers comprising at least two transistors, the at least two transistors comprising collectors, each collector being part of one of plural series circuits containing a resistor, the series circuits being positioned between a power supply potential terminal and a first shared emitter node and/or a second shared emitter node, sets of the collectors being interconnected to form a D flip-flop structure, the output terminals being at an output of at least one differential amplifier;

a first current source to connect the first shared emitter node to a reference potential terminal;

a second current source to connect the second shared emitter node to the reference potential terminal;

a first switch directly connected to the power supply potential terminal and directly connected to the first shared emitter node, the first switch having a first control terminal that comprises part of the input terminals; and a second switch directly connected to the supply potential terminal and directly connected to the second shared emitter node, the second switch having a second control terminal that comprises part of the input terminals.

2. The flip-flop circuit of claim 1, wherein the differential amplifiers comprise:

a first differential amplifier comprising a first pair of emitter-coupled transistors connected to the first shared emitter node, the first pair of emitter-coupled transistors comprising collector terminals that form at least parts of a first circuit node and a second circuit node, the first pair of emitter-coupled transistors comprising base terminals that are cross-connected to collector terminals;

a second differential amplifier comprising a second pair of emitter-coupled transistors connected to the second shared emitter node, the second pair of emitter-coupled transistors comprising collector terminals that are connected to the first circuit node and/or to the second circuit node, the second pair of emitter-coupled transistors comprising base terminals that form at least parts of a third circuit node and a fourth circuit node;

a third differential amplifier comprising a third pair of emitter-coupled transistors connected to the second shared emitter node, the third pair of emitter-coupled transistors comprising collector terminals that are connected to the third circuit node and/or to the fourth circuit node, the third pair of emitter-coupled transistors comprising base terminals that are cross-connected to collector terminals; and a fourth differential amplifier comprising a fourth pair of emitter-coupled transistors connected to the first shared emitter node, the fourth pair of emitter-coupled transistors comprising collector terminals that are connected to the third circuit node and/or to the fourth circuit node, the fourth pair of emitter-coupled transistors comprising base terminals that are connected to the second circuit node and/or to the first circuit node.

3. The flip-flop circuit of claim 2, wherein the first, the second, the third, and the fourth circuit nodes are each connected via a resistor in a series circuit to the power supply potential terminal.

4. The flip-flop circuit of claim 2, wherein the first, the second, the third, and the fourth differential amplifiers and the first and the second switches are implemented using bipolar circuit technology.

5. The flip-flop circuit of claim 1, wherein the first current source and the second current source each comprise a transistor implemented using metal oxide semiconductor circuit technology.

6. The flip-flop circuit of claim 1, wherein the flip-flop circuit is implemented in emitter-coupled logic circuit technology.

7. A shift register comprising the flip-flop circuit of claim 1.

8. A flip-flop circuit comprising:

input terminals to provide a clock signal;

output terminals to provide an output signal, a first differential amplifier comprising first emitter-coupled transistors having emitters connected to a first emitter node, the first emitter-coupled transistors comprising collector terminals that form at least parts of a first circuit node and a second circuit node, the first emitter-coupled transistors comprising base terminals that are cross-connected to collector terminals of the first emitter-coupled transistors;

a second differential amplifier comprising second emitter-coupled transistors having emitters connected to a second emitter node, the second emitter-coupled transistors comprising collector terminals that are connected to the first circuit node and/or to the second circuit node, the second emitter-coupled transistors comprising base terminals that form at least parts of a third circuit node and a fourth circuit node;

a third differential amplifier comprising third emitter-coupled transistors having emitters connected to the second emitter node, the third emitter-coupled transistors comprising collector terminals that are connected to the third circuit node and/or to the fourth circuit node, the third emitter-coupled transistors comprising base terminals that are cross-connected to collector terminals of the third emitter-coupled transistors; and a fourth differential amplifier comprising fourth emitter-coupled transistors having emitters connected to the first emitter node, the fourth emitter-coupled transistors comprising collector terminals that are connected to the third circuit node and/or to the fourth circuit node, the fourth emitter-coupled transistors comprising base terminals that are connected to the second circuit node and/or to the first circuit node;

a reference potential that is connectable to the first emitter node and to the second emitter node;

a first switch directly connected to a power supply potential terminal and directly connected to the first emitter node, the first switch having a first control terminal that comprises part of the input terminals; and a second switch directly connected to the supply potential terminal and directly connected to the second emitter node, the second switch having a second control terminal that comprises part of the input terminals.

9. The flip-flop circuit of claim 8, wherein the first, the second, the third, and the fourth circuit nodes are each connected via a resistor in a series circuit to the power supply potential terminal.

10. The flip-flop circuit of claim 8, wherein the first, the second, the third, and the fourth differential amplifiers and the first and the second switches are implemented using bipolar circuit technology.

11. The flip-flop circuit of claim 8, further comprising:

a first current source to connect the first emitter node to the reference potential terminal; and a second current source to connect the second emitter node to the reference potential terminal.

12. The flip-flop circuit of claim 11, wherein the first current source and the second current source each comprise a transistor implemented using metal oxide semiconductor circuit technology.

13. The flip-flop circuit of claim 8, wherein the flip-flop circuit is implemented in emitter-coupled logic circuit technology.

14. A shift register comprising the flip-flop circuit of claim 8.

* * * * *

UNITED STATES PATENT AND TRADEMARK OFFICE

CERTIFICATE OF CORRECTION

PATENT NO. : 7,626,433 B2
APPLICATION NO. : 10/554970
DATED : December 1, 2009
INVENTOR(S) : Wolfgang Hoess It is certified that error appears in the above-identified patent and that said Letters Patent is hereby corrected as shown below:

Title page, Column 1, Line 1, Title:
Delete "FLIP-FLOP CIRCUIT ASSEMBLY" and Insert -- FLIP-FLOP CIRCUIT THAT INCLUDES DIFFERENTIAL AMPLIFIERS --

Cover page, Column 2, Abstract:
Delete "A flip-flop circuit arrangement having a total of four differential amplifiers (1, 2, 3, 4), which are connected to one another to produce a D flip-flop, is specified. According to the suggested principle, the two shared emitter nodes (E1, E2) of the differential amplifiers (1, 2, 3, 4) are connected via a switch pair (S1, S2) to supply potential and are activated by a differential input clock signal at a control input (CN, CP). The present flip-flop circuit is operable using especially low supply voltage (VCC) and is preferably suitable for constructing frequency dividers or shift registers."
Insert -- A flip-flop circuit includes a first differential amplifier with first emitter-coupled transistors having emitters connected to a first emitter node, where the first emitter-coupled transistors include collector terminals that form at last parts of a first circuit node and a second circuit node, and base terminals that are cross-connected to collector terminals of the first emitter-coupled transistors. A second differential amplifier includes second emitter-coupled transistors having emitters connected to a second emitter node, where the second emitter-coupled transistors include collector terminals that are connected to the first circuit node and/or to the second circuit node, and base terminals that form at least part of a third circuit node and a fourth circuit node. A third differential amplifier includes third emitter-coupled transistors having emitters connected to the second emitter node, where the third emitter-coupled transistors include collector terminals that are connected to the third circuit node and/or to the fourth circuit node, and base terminals that are cross-connected to collector terminals of the third emitter-coupled transistors. A fourth differential amplifier includes fourth emitter-coupled transistors having emitters connected to the first emitter node, where the fourth emitter-coupled transistors include collector terminals that are connected to the third circuit node and/or to the fourth circuit node, and base terminals that are connected to the second circuit node and/or to the first circuit node; --

Column 1, Line 1, Title:
Delete "FLIP-FLOP CIRCUIT ASSEMBLY" and Insert -- FLIP-FLOP CIRCUIT THAT INCLUDES DIFFERENTIAL AMPLIFIERS --

Signed and Sealed this

Second Day of February, 2010

David J. Kappos

David J. Kappos
*Director of the United States Patent and Trademark Office*